(12) United States Patent
Cheng et al.

(10) Patent No.: US 10,164,056 B2
(45) Date of Patent: Dec. 25, 2018

(54) VERTICAL FIELD EFFECT TRANSISTORS WITH UNIFORM THRESHOLD VOLTAGE

(71) Applicant: International Business Machines Corporation, Armonk, NY (US)

(72) Inventors: Kangguo Cheng, Schenectady, NY (US); Xin Miao, Guilderland, NY (US); Heng Wu, Guilderland, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/597,573

(22) Filed: May 17, 2017

(65) Prior Publication Data

US 2018/0337255 A1    Nov. 22, 2018

(51) Int. Cl.
| | |
|---|---|
| *H01L 29/66* | (2006.01) |
| *H01L 29/40* | (2006.01) |
| *H01L 29/423* | (2006.01) |
| *H01L 29/78* | (2006.01) |
| *H01L 27/08* | (2006.01) |
| *H01L 27/088* | (2006.01) |

(52) U.S. Cl.
CPC ...... *H01L 29/66666* (2013.01); *H01L 27/088* (2013.01); *H01L 29/401* (2013.01); *H01L 29/42356* (2013.01); *H01L 29/7827* (2013.01)

(58) Field of Classification Search
CPC ............ H01L 29/66666; H01L 27/088; H01L 29/7827; H01L 29/401; H01L 29/42356; H01L 29/66545; H01L 29/785; H01L 29/66795; H01L 29/4966; H01L 29/41791; H01L 29/78642; H01L 21/823814; H01L 21/823821; H01L 21/823857; H01L 21/845
USPC ........................................................ 257/329
See application file for complete search history.

(56) References Cited

U.S. PATENT DOCUMENTS

| | | |
|---|---|---|
| 5,973,382 A | 10/1999 | Burgener et al. |
| 6,664,143 B2 | 12/2003 | Zhang |
| 8,324,668 B2 | 12/2012 | Huang et al. |

(Continued)

OTHER PUBLICATIONS

Cheng et al. "Fabrication of Vertical Field Effect Transistor Structure With Controlled Gate Length," U.S. Appl. No. 15/087,074, filed Mar. 31, 2016.

(Continued)

*Primary Examiner* — Caleen Sullivan
(74) *Attorney, Agent, or Firm* — Cantor Colburn LLP; Vazken Alexanian

(57) ABSTRACT

Provided is a method for forming a semiconductor structure. In one or more embodiments of the invention, the method includes forming a semiconductor fin on a substrate and decreasing a width of the semiconductor fin. The method further includes forming a spacer layer on a surface of the substrate and forming a high dielectric constant layer on exposed surfaces of the semiconductor fin and the spacer layer. The method also includes forming a work function metal layer on the high dielectric constant layer. The method also includes removing portions of the work function metal layer and the high dielectric constant layer to expose portions of the spacer layer. A thickness of the remaining work function metal layer on sidewalls of the semiconductor fin is uniform.

7 Claims, 13 Drawing Sheets

(56) References Cited

U.S. PATENT DOCUMENTS

| | | |
|---|---|---|
| 9,209,179 B2 | 12/2015 | Lee et al. |
| 9,299,835 B1 | 3/2016 | Anderson et al. |
| 9,437,503 B1 | 9/2016 | Mallela et al. |
| 2011/0147765 A1 | 6/2011 | Huang et al. |
| 2011/0233512 A1 | 9/2011 | Yang et al. |
| 2014/0124876 A1 | 5/2014 | Kim et al. |
| 2014/0239407 A1 | 8/2014 | Manabe et al. |
| 2015/0262828 A1 | 9/2015 | Brand et al. |
| 2016/0118500 A1* | 4/2016 | Wu .................... H01L 29/7851 257/401 |
| 2017/0025526 A1* | 1/2017 | Cho ................ H01L 29/66545 |

OTHER PUBLICATIONS

List of IBM Patents or Patent Applications Treated as Related, U.S. Appl. No. 15/597,573, filed May 17, 2017, 2 Pages.

Kangguo Cheng et al. "Vertical Field Effect Transistors With Uniform Threshold Voltage," U.S. Appl. No. 15/910,506, filed Mar. 2, 2018.

\* cited by examiner

VERTICAL FIELD EFFECT TRANSISTORS WITH UNIFORM THRESHOLD VOLTAGE

BACKGROUND

The present invention generally relates to vertical field effect transistors (FETs). More specifically, the present invention relates to vertical FETs (VFETs) with uniform threshold voltage ($V_t$).

Non-planar transistors such as VFETs can achieve a reduced FET device footprint without compromising FET device performance characteristics. In VFETs the source-drain current flows in a direction perpendicular to a major surface of the substrate. For example, in a known VFET configuration, the substrate surface is horizontal and a vertical fin or nanowire extends upward from the substrate surface. The fin or nanowire forms the channel region of the transistor. Source and drain regions are situated in electrical contact with the top and bottom ends of the channel region, while the gate is disposed on one or more of the fin or nanowire sidewalls.

SUMMARY

One or more embodiments of the invention provide a method for forming a semiconductor structure. The method includes forming a semiconductor fin on a substrate and decreasing a width of the semiconductor fin. The method further includes forming a spacer layer on a surface of the substrate and forming a high dielectric constant layer on exposed surfaces of the semiconductor fin and the spacer layer. The method can also include forming a work function metal layer on the high dielectric constant layer and removing portions of the work function metal layer and the high dielectric constant layer to expose portions of the spacer layer. A thickness of the remaining work function metal layer on sidewalls of the semiconductor fin is uniform.

One or more embodiments of the invention provide a semiconductor structure. The semiconductor structure includes a semiconductor fin on a substrate and a spacer layer on a surface of the substrate. The semiconductor structure also includes a high dielectric constant layer. A first portion of the high dielectric constant layer is on sidewalls of the semiconductor fin. A second portion of the high dielectric constant layer is over the spacer layer. The semiconductor structure can also include a work function metal layer on sidewalls of the semiconductor fin. The work function metal layer has uniform thickness.

One or more embodiments of the invention provide a semiconductor structure. The semiconductor structure includes semiconductor fins on a substrate. The semiconductor fins are arranged in a direction. The semiconductor structure further includes a spacer layer between the semiconductor fins. The spacer layer is on a surface of the substrate upon which the semiconductor fins are formed. The semiconductor structure further includes a work function metal layer on sidewalls of the semiconductor fins. A thickness of the work function metal layer in the direction can be uniform. The semiconductor structure also includes a high dielectric constant layer. A first portion of the high dielectric constant layer is on sidewalls of the semiconductor fins, and a second portion of the high dielectric constant layer is over the spacer layer.

BRIEF DESCRIPTION OF THE DRAWINGS

The subject matter of embodiments is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
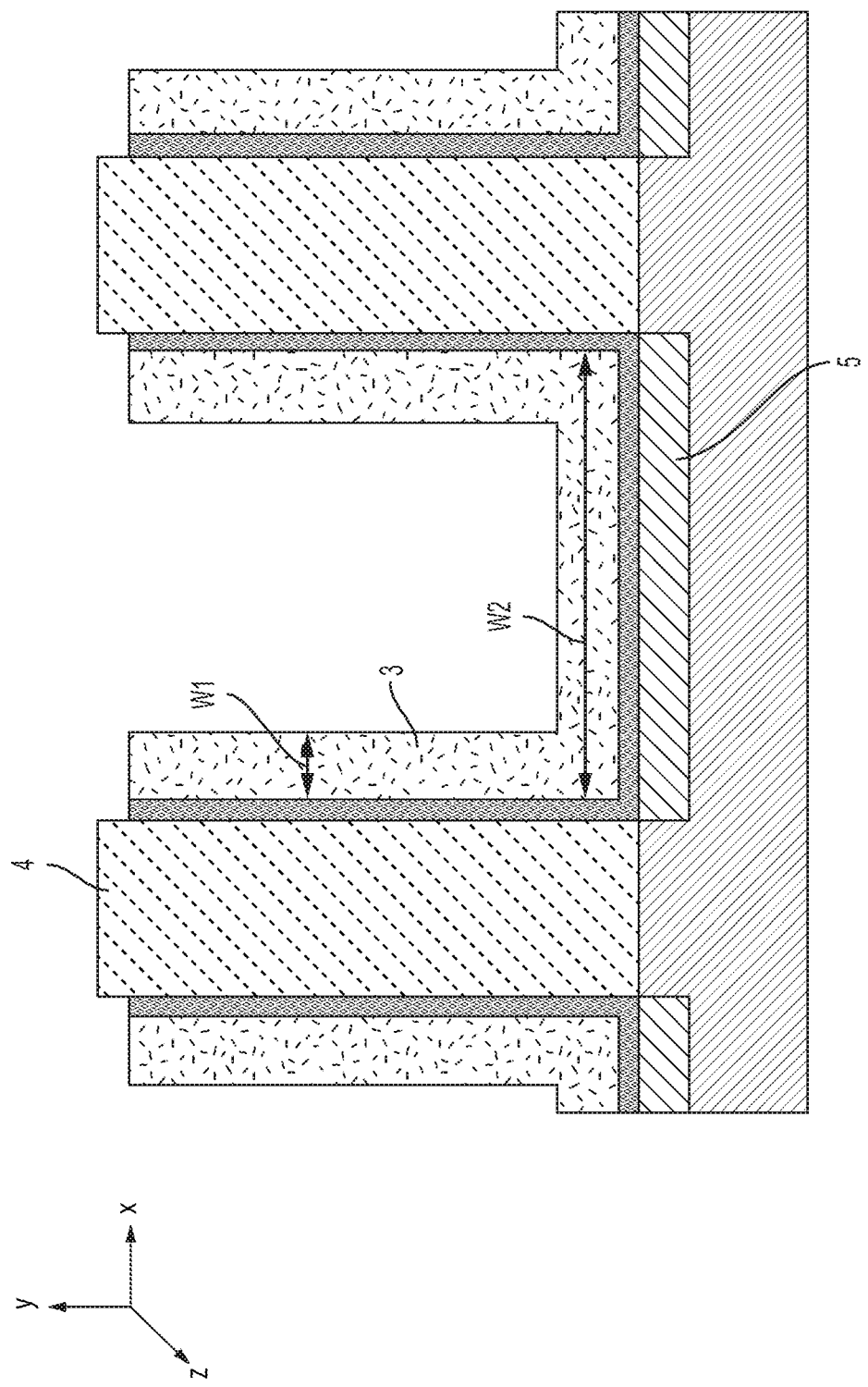
FIG. 1 depicts a cross-sectional view of a semiconductor structure of a conventional approach.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, ALD among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of one or more embodiments of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

As previously described herein, vertical-type transistors such as vertical FETs (VFETs) are non-planar FET configurations that achieve a reduced FET device footprint in comparison to planar FET devices. There are challenges, however, in providing VFETs with equal or superior performance characteristics to lateral devices, as described in more detail below with respect to FIG. 1.

FIG. 1 depicts a cross-sectional view of a conventional VFET having a work function metal (WFM) 3 deposited conformally over a channel region of a VFET fin 4 and a bottom spacer 5, for example, by atomic layer deposition (ALD). With the semiconductor structure of FIG. 1, a thickness W2 of the work function metal 3 at the bottom of fin 4 is greater than a thickness W1 at the top of fin 4. Threshold voltage changes as a function of the thickness of the work function metal 3. As such, a threshold voltage at the top of VFET fin 4 (which corresponds to thickness W1) is different than a threshold voltage at the bottom of VFET fin 4 (which corresponds to thickness W2). Therefore, with conventional approaches having a uniformly deposited WFM, the thickness of WFM 3 can differ over the channel region, and consequently, the threshold voltage of VFET fin 4 is not consistent/uniform.

In view of the shortcomings of the conventional approaches of configuring VFETs, one or more embodiments of the present invention provide methods and structures that provide VFETs with a uniform threshold voltage. In one or more embodiments of the invention, the thickness of WFM that is provided along each VFET fin can be of a uniform thickness. For example, the thickness of WFM as measured in a direction orthogonal to the VFET channel (e.g., the x-direction) can be of a uniform thickness. As described above, because threshold voltage is dependent upon a thickness of WFM, a WFM of uniform thickness will thus result in a uniform threshold voltage for the corresponding VFETs. One or more embodiments can provide a WFM of uniform thickness by removing a portion of WFM 3 that is disposed above bottom spacer 5, as described in more detail below. Methods for forming semiconductor structures in accordance with one or more embodiments of the invention are described in detail below by referring to the accompanying drawings in FIGS. 2-13.

Figure 2:
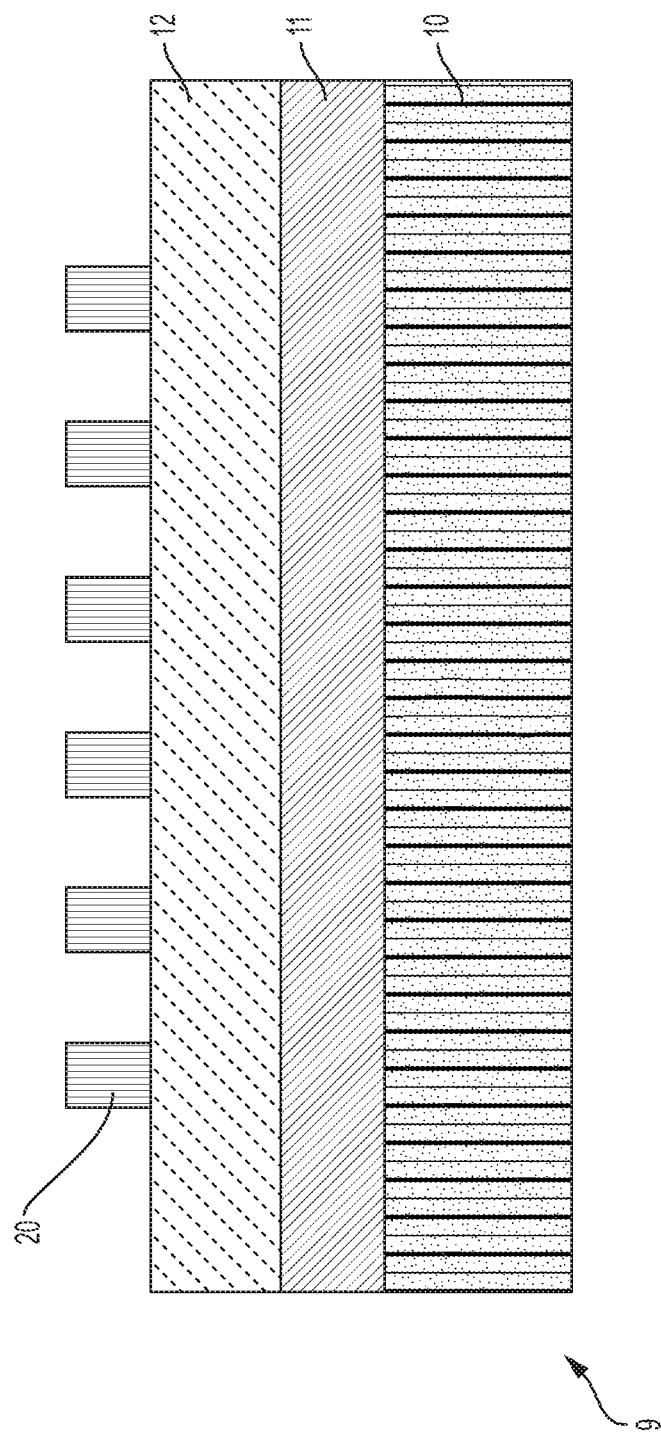
FIG. 2 depicts a cross-sectional view of a semiconductor structure after a processing operation according to one or more embodiments of the present invention.

FIG. 2 depicts a cross-sectional view of a VFET semiconductor structure 9 after a processing operation according to one or more embodiments of the invention. As depicted in FIG. 2, a partially fabricated semiconductor structure 9 can include a top hard mask layer 20 on a substrate 10.

The semiconductor structure 9 can further include a top semiconductor layer 12 formed over the substrate 10.

In one or more embodiments of the invention, substrate 10 can include a semiconductor material, such as, for example, Si, Ge, SiGe, SiC, SiGeC, and III/V compound semiconductors. Substrate 10 can provide mechanical support to the top semiconductor layer 12. The thickness of the substrate 10 can be, for example, from 30 µm to about 2 mm.

The top semiconductor layer 12 can include a semiconductor material such as, for example, Si, Ge, SiGe, SiC, SiGeC, and III/V compound semiconductors such as, for example, InAs, GaAs, and InP. The semiconductor materials of the top semiconductor layer 12 and the substrate 10 can be the same or different. Each of the substrate 10 and the top semiconductor layer 12 can include a single crystalline semiconductor material, such as, for example, single crystalline silicon. The thickness of the top semiconductor layer 12 can be from 10 nm to 200 nm, for example, from 30 nm to 70 nm.

The semiconductor structure 9 can also include a heavily doped source or drain (S/D) region 11 (hereinafter heavily doped region 11). Examples of p-type dopants include, for example, boron, aluminum, gallium and indium. Examples of n-type dopants, include antimony, arsenic and phosphorous. As described above, semiconductor doping is the modification of electrical properties by doping, for example, transistor sources and drains, generally by diffusion and/or by ion implantation. Selective doping of various regions of the semiconductor substrate allows the conductivity of the substrate to be changed with the application of voltage.

In one or more embodiments of the invention, the hard mask layer 20 can be formed on the top semiconductor layer 12 prior to forming semiconductor fins. The hard mask layer 20 can include an oxide, nitride, oxynitride or any combination thereof including multilayers. In one or more embodiments of the invention, the hard mask layer 20 can include silicon oxide or silicon nitride. The hard mask layer 20 can be formed utilizing a deposition process such as, for example, CVD, PECVD, chemical solution deposition, and/or evaporation. In one or more embodiments of the invention, the hard mask layer 20 can be formed by a thermal process such as, for example, oxidation or nitridation of the top semiconductor layer 12. Any combination of the above mentioned processes can also be used in forming the hard mask layer 20. The hard mask layer 20 can have a thickness from 20 nm to 80 nm, for example, from 30 nm to 60 nm.

Figure 3:
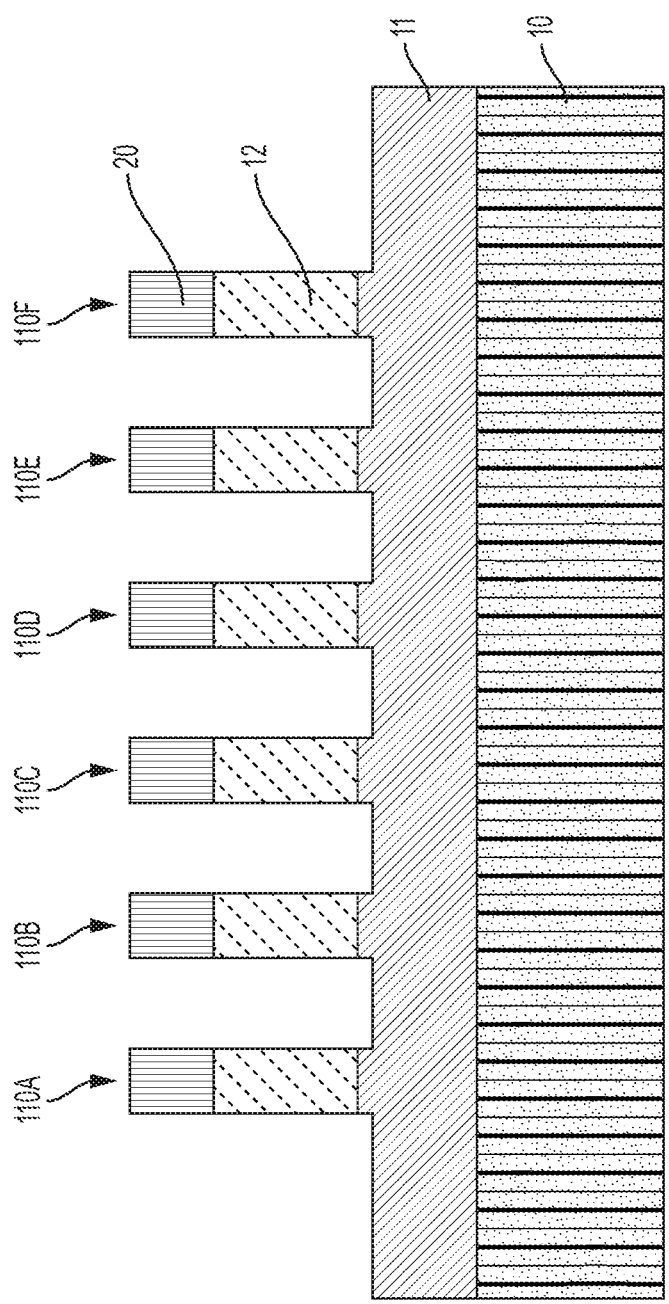
FIG. 3 depicts a cross-sectional view of the semiconductor structure after another processing operation according to one or more embodiments of the present invention.

FIG. 3 depicts a cross-sectional view of the VFET semiconductor structure after another processing operation according to one or more embodiments of the invention. As depicted in FIG. 3, the top semiconductor layer 12 can be patterned to form a plurality of vertical semiconductor fins (110A-110F). In one or more embodiments of the invention, the semiconductor fins (110A-110F) can be formed by lithography and etching. The lithographic step can include applying a photoresist layer (not depicted) atop the hard mask layer 20, exposing the photoresist layer to a desired pattern of radiation, and developing the exposed photoresist layer utilizing a resist developer. The etching process can include dry etching and/or wet chemical etching. Examples of dry etching processes that can be used include reactive ion etching (RIE), ion beam etching, plasma etching or laser ablation. The etching process can transfer the pattern from the patterned photoresist layer to the hard mask layer 20 and to the top semiconductor layer 12. In one or more embodiments, the etching process can use ultra-violet (UV) radiation. One or more embodiments can use multi-patterning (e.g., self-aligned double patterning, self-aligned triple patterning, and/or self-aligned quadruple patterning) to transfer the necessary patterns. After transferring the pattern onto the top semiconductor layer 12, the patterned photoresist layer can be removed utilizing a resist stripping process such as, for example, ashing.

Each of the semiconductor fins (110A-110F) can have a height ranging from 1 nm to 150 nm, for example, from 10 nm to 50 nm. Each of the semiconductor fins (110A-110F) can have a width ranging from 5 nm to 40 nm, for example, from about 10 to about 30 nm or from 10 nm to 20 nm. Adjacent semiconductor fins (110A-110F) can be separated by a pitch ranging from 20 nm to 100 nm, for example, from 30 nm to 50 nm.

Figure 4:
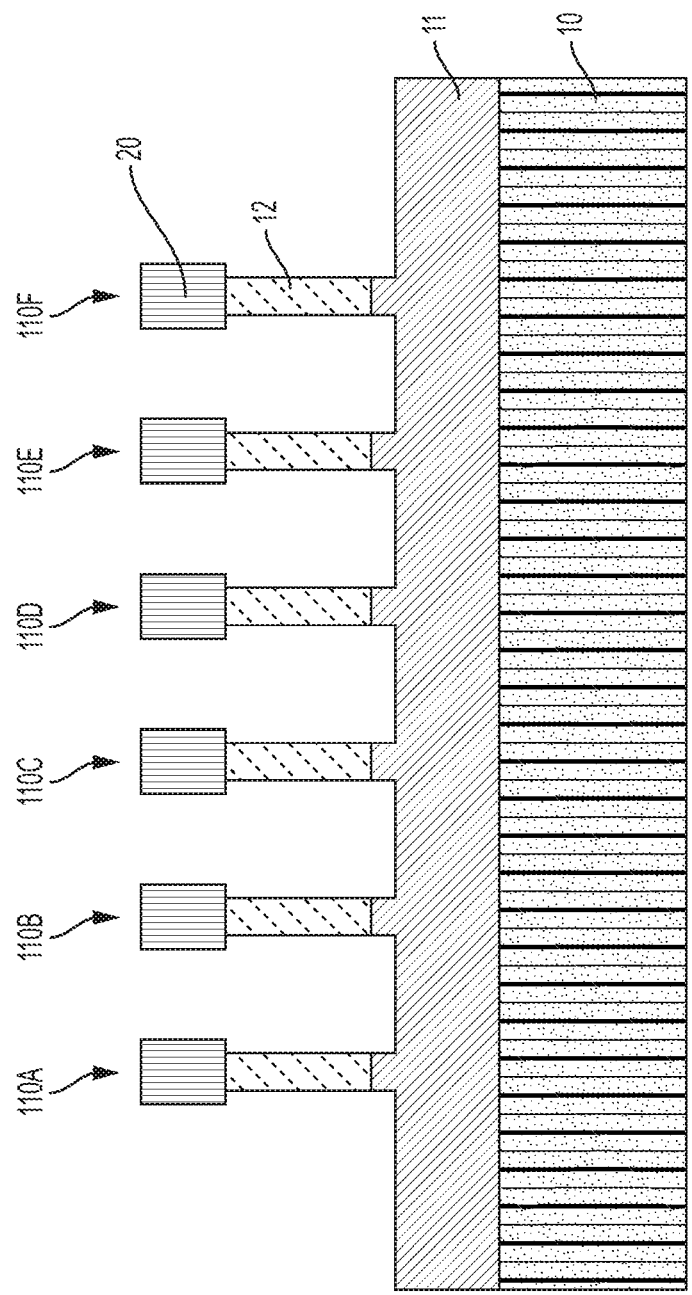
FIG. 4 depicts a cross-sectional view of the semiconductor structure after another processing operation according to one or more embodiments of the present invention.
Figure 7:
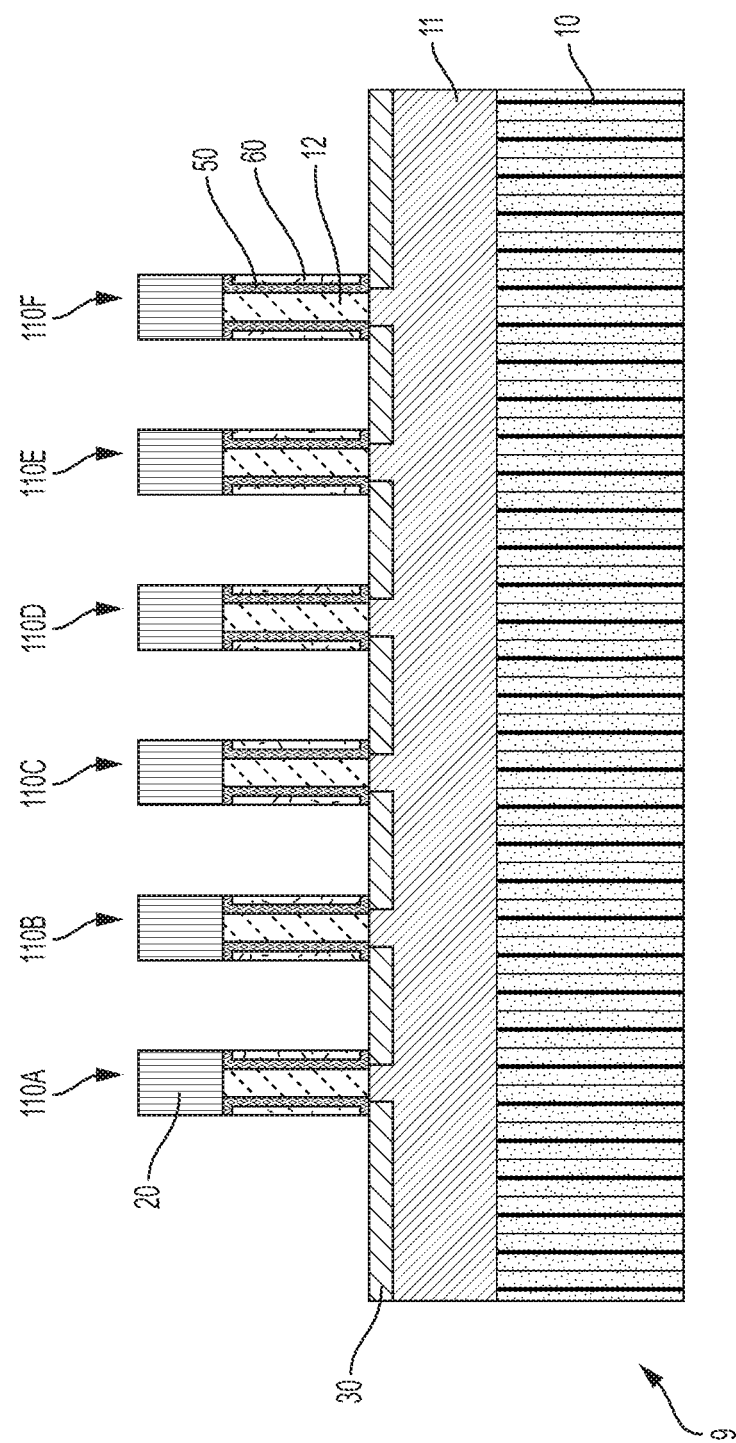
FIG. 7 depicts a cross-sectional view of the semiconductor structure after another processing operation according to one or more embodiments of the present invention.

FIG. 4 depicts a cross-sectional view of the VFET semiconductor structure after another processing operation according to one or more embodiments of the invention. As depicted in FIG. 4, one or more embodiments can decrease a width of each fin of the semiconductor fins (110A-110F). The width of each of the semiconductor fins (110A-110F) can be decreased by using an etching process such as, for example, an isotropic etching. The isotropic etching process can include, for example, a wet etching process. The width of each semiconductor fin can be decreased in order to accommodate subsequent formation of a WFM 60 and a high dielectric constant layer 50 along the side of each fin (see FIG. 7), where the combined thickness of WFM 60 and high dielectric constant layer 50 is based on hard mask layer 20. As shown in FIG. 7, the combined thickness of the added WFM 60 and the added high dielectric constant layer 50 can be configured such that the resulting sidewall is flush with the sidewall of hard mask layer 20. Alternatively, the combined thickness of the added WFM 60 and the added high dielectric constant layer 50 can be smaller such that the resulting sidewall is beneath the sidewall of hard mask layer 20. Decreasing the width of the semiconductor fins (110A-110F) can include etching from about 2 to about 7 nm per side of the semiconductor fins (110A-110F).

Figure 5:
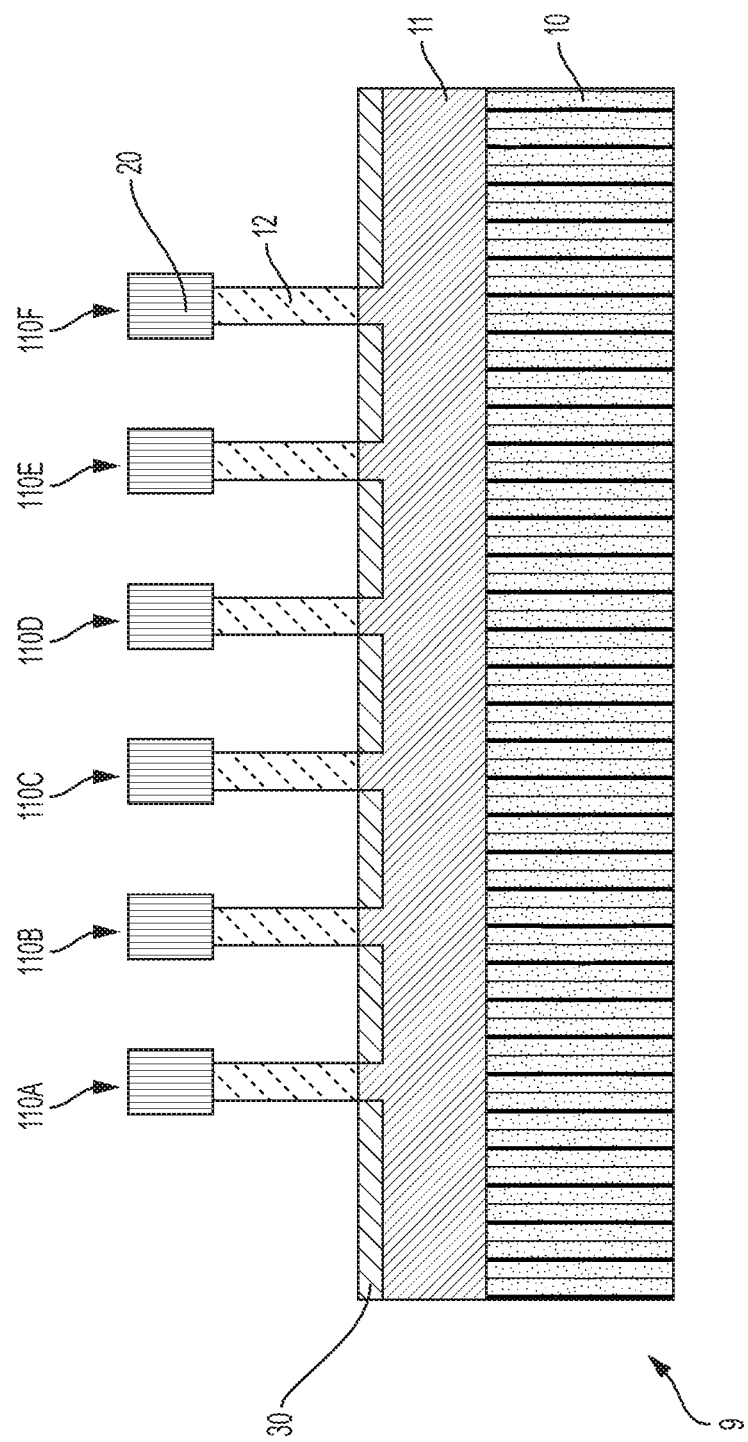
FIG. 5 depicts a cross-sectional view of the semiconductor structure after another processing operation according to one or more embodiments of the present invention.

FIG. 5 depicts a cross-sectional view of the VFET semiconductor structure after another processing operation according to one or more embodiments of the invention. As depicted in FIG. 5, a bottom spacer 30 can be formed, e.g., on the heavily doped region 11. The bottom spacer 30 can include a dielectric material, such as silicon oxide, silicon nitride, silicon oxynitride, or a combination thereof, and can be formed using, for example, an oxide filling process. Following deposition of the dielectric material, the dielectric material can be recessed to form the bottom spacer 30.

Figure 6:
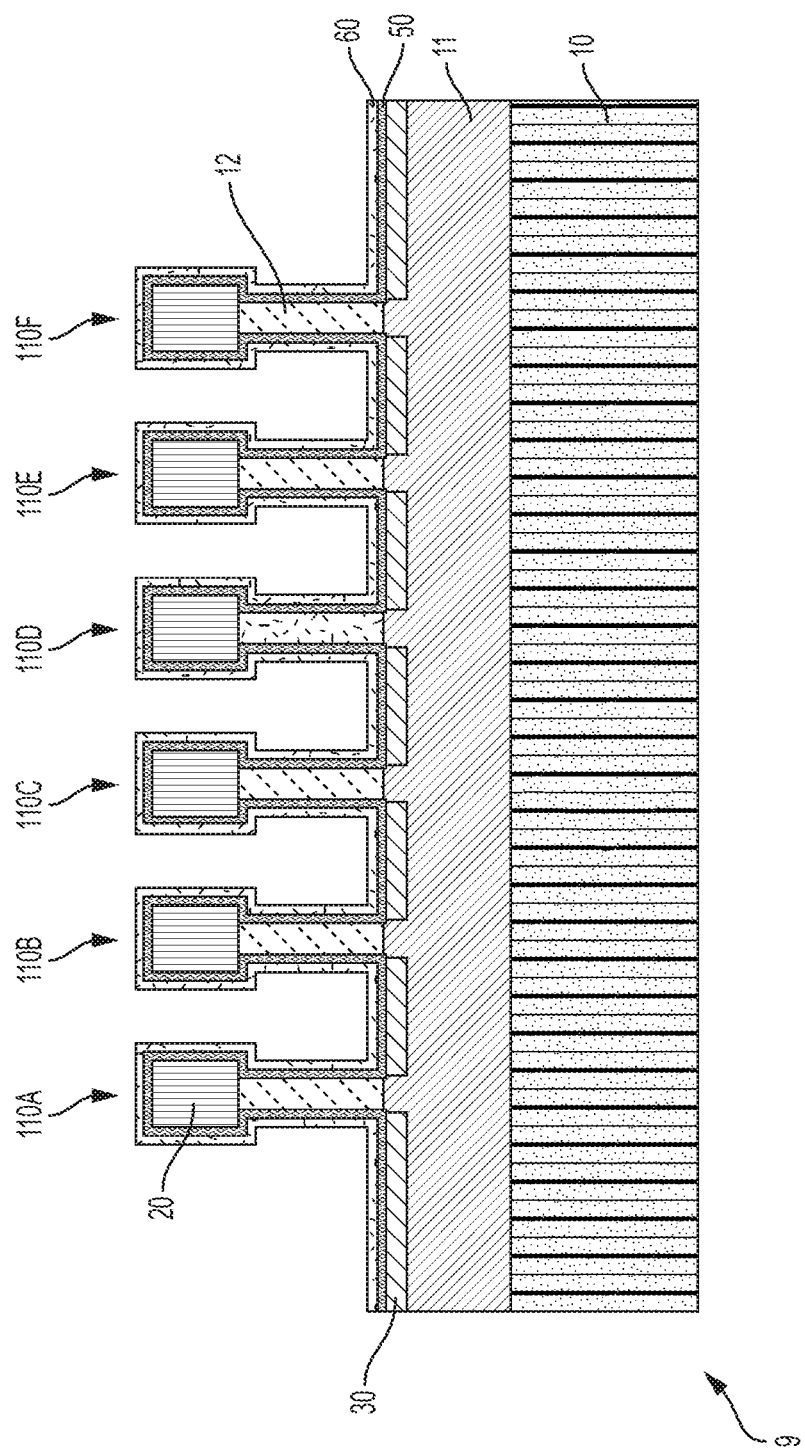
FIG. 6 depicts a cross-sectional view of the semiconductor structure after another processing operation according to one or more embodiments of the present invention.

FIG. 6 depicts a cross-sectional view of the VFET semiconductor structure after another processing operation according to one or more embodiments of the invention. As depicted in FIG. 6, a high dielectric constant layer 50 can be deposited, for example, conformally, on the semiconductor fins (110A-110F), hard mask layer 20, and bottom spacer 30, followed by deposition of a WFM 60 on the high dielectric constant layer 50.

The high dielectric constant layer 50 can include an oxide, nitride or oxynitride. For example, the high dielectric constant layer 50 can include a high dielectric constant material having a dielectric constant greater than silicon dioxide. Exemplary high dielectric constant materials include, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. The WFM 60 can include but is not limited to, for example, TiN, TiC, and/or TiAlC.

FIG. 7 depicts a cross-sectional view of the VFET structure after another processing operation according to one or more embodiments of the invention. As depicted in FIG. 7, portions of the high dielectric constant layer 50 and WFM 60 can be removed from the hard mask 20 and bottom spacer 30, for example, by an anisotropic etching process such as RIE. The hard mask 20 prevents removal of the high dielectric constant layer 50 and WFM 60 close to the semiconductor fins (110A-110F). In this manner, the high dielectric constant layer 50 and WFM 60 under the hard mask 20 can avoid being etched or removed. After removing portions of the WFM 60 and the high dielectric constant layer 50 from the hard mask 20, a combined width of each of the semiconductor fins 110A-110F, the high dielectric constant layer 50, and the WFM 60 can be equal to a width of the hard mask 20.

As described above, one or more embodiments remove a portion of WFM 60 that is not positioned under hard mask 20. With the removal of this portion of WFM 60 (which was previously disposed on bottom spacer 30), one or more embodiments can configure the thickness of WFM 60 to be of uniform thickness along each semiconductor fin (110A-110F). Specifically, one or more embodiments configure the thickness of WFM 60 to be of uniform thickness as measured in a direction in which the VFETs are arranged (e.g., the x-direction). As such, in contrast to the conventional approaches which do not remove any portion of the WFM from atop the bottom spacer (and thus do not provide a WFM of uniform thickness), one or more embodiments can remove portions of WFM 60 to configure the WFM 60 to be of uniform thickness along the semiconductor fins (110A-110F). Therefore, as described above, because threshold voltage is a function of a thickness of WFM, a WFM of uniform thickness will thus result in a uniform threshold voltage for the corresponding VFETs.

Figure 8:
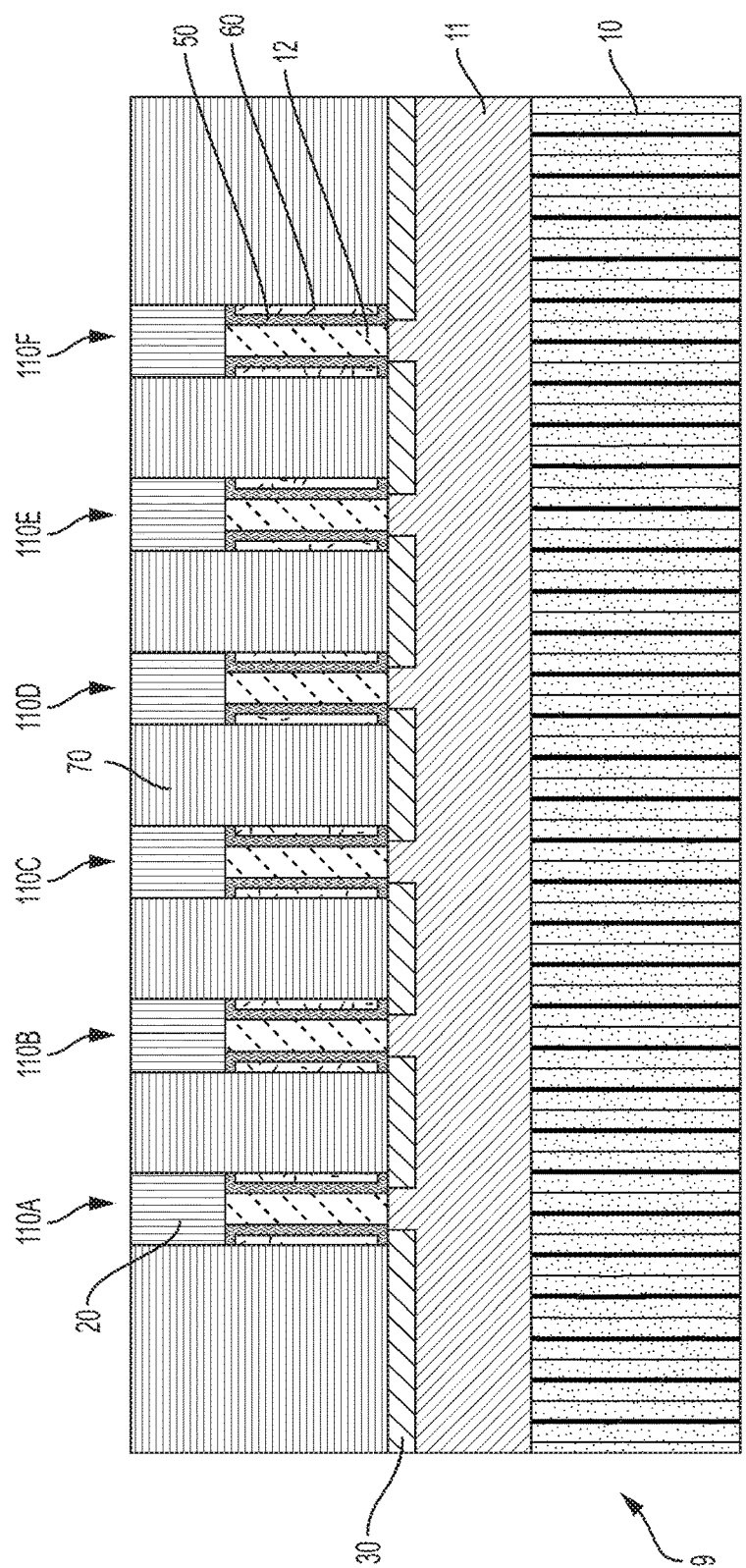
FIG. 8 depicts a cross-sectional view of the semiconductor structure after another processing operation according to one or more embodiments of the present invention.

FIG. 8 depicts a cross-sectional view of the VFET semiconductor structure after another processing operation according to one or more embodiments of the invention. As depicted in FIG. 8, a low resistance, or gate, metal 70 can be deposited on the bottom spacer 30, and a CMP can be performed. In one or more embodiments of the invention, the low resistance metal 70 can be deposited directly on the bottom spacer 30. The low resistance metal 70 can be made of any suitable gate material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

As depicted in FIG. 8, one or more embodiments can configure WFM 60 to have a uniform thickness around each VFET, for example, in a direction in which the VFETs are arranged, e.g., in an x-direction. The uniform thickness of WFM 60 can provide a uniform threshold voltage for each VFET in a region from the bottom spacer 30 through the low resistance metal 70 such as, for example, in a region extending in a y-direction from the bottom spacer 30 through the low resistance metal 70. The source-drain current can flow in the VFETs in a direction perpendicular to the substrate surface, e.g., the source-drain current can flow in the y-direction.

Figure 9:
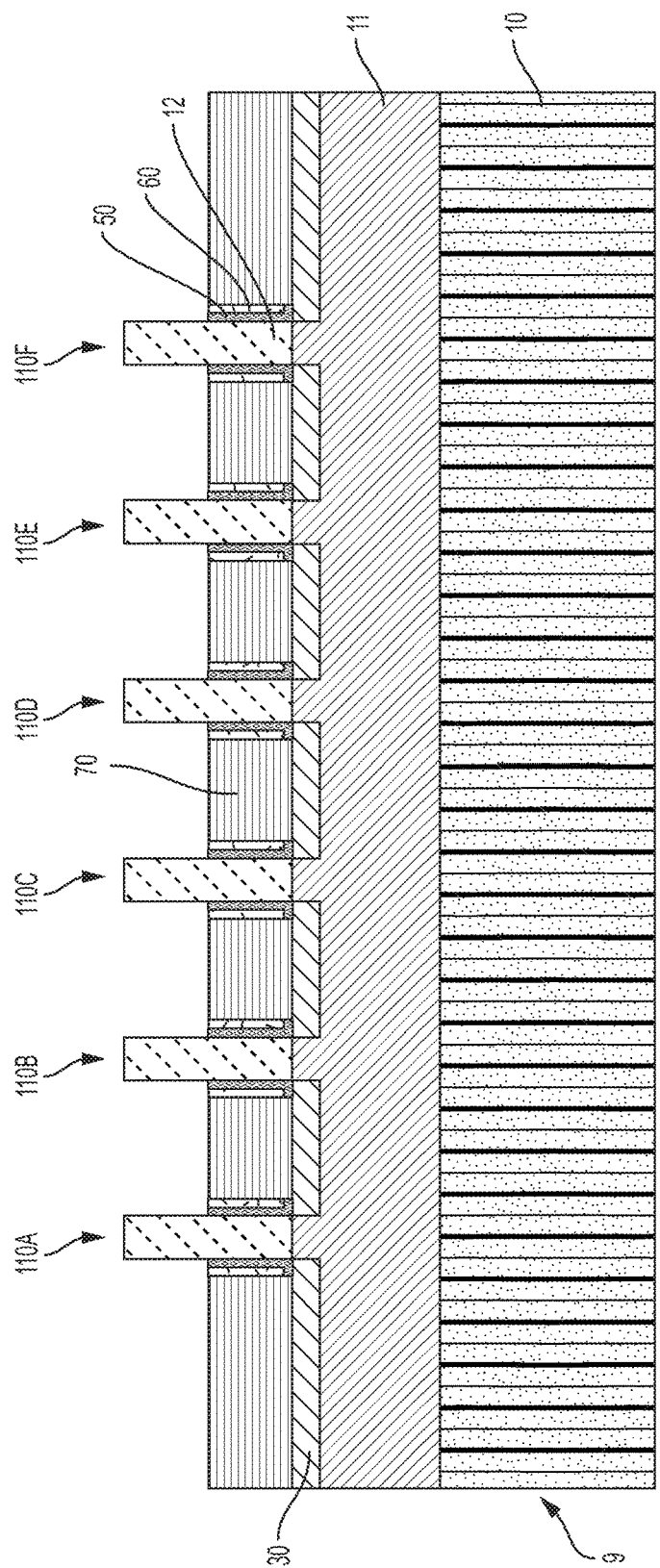
FIG. 9 depicts a cross-sectional view of the semiconductor structure after another processing operation according to one or more embodiments of the present invention.

FIG. 9 depicts a cross-sectional view of the VFET semiconductor structure after another processing operation according to one or more embodiments of the invention. As depicted in FIG. 9, the hard mask 20 can be removed and the high dielectric constant layer 50, WFM 60, and low resistance metal 70 can be recessed. As shown by FIG. 9, the high dielectric constant layer 50 can be configured as an L-shape in a cross-section view, with a first portion of the high dielectric constant layer 50 formed over the channel region of the fin (110A-110F) and a second portion of the high dielectric constant layer 50 formed over the bottom spacer 30.

Figure 10:
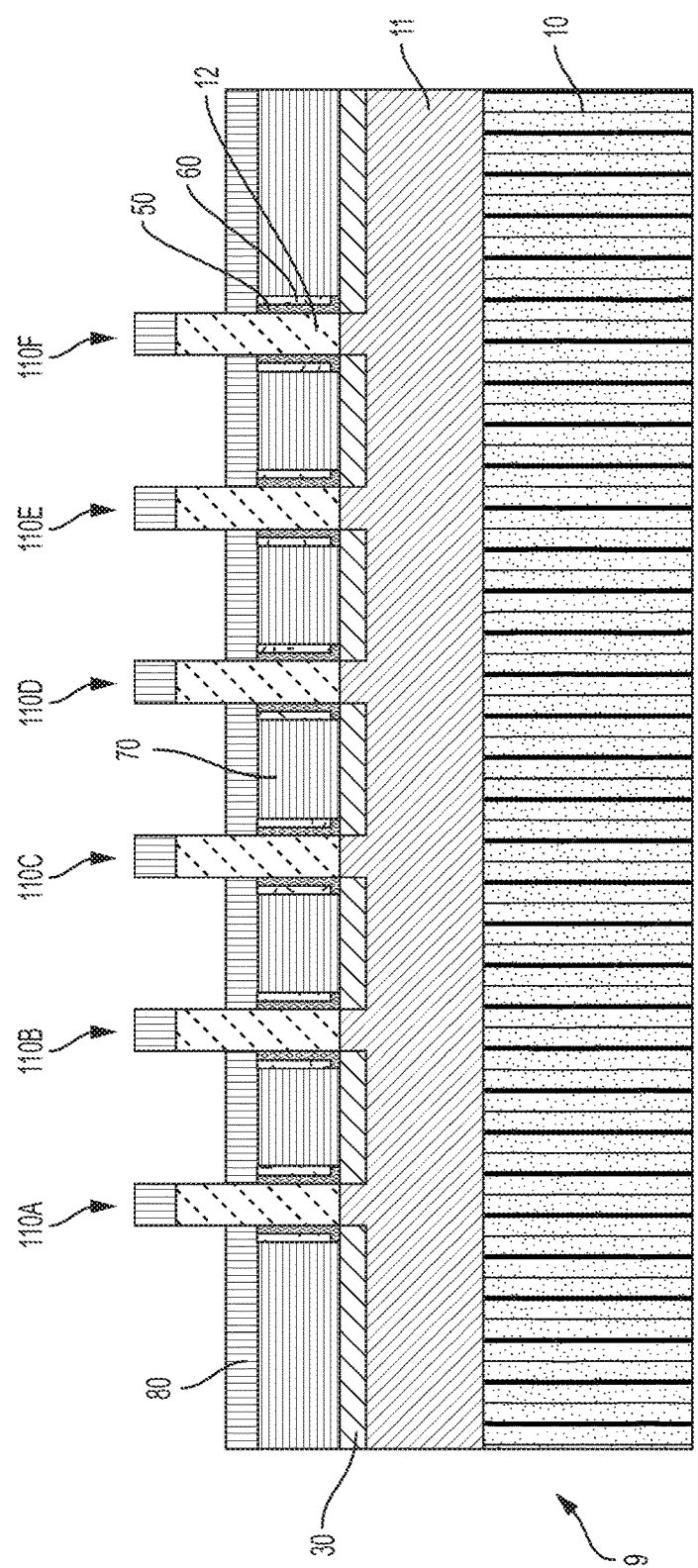
FIG. 10 depicts a cross-sectional view of the semiconductor structure after another processing operation according to one or more embodiments of the present invention.

FIG. 10 depicts a cross-sectional view of the VFET semiconductor structure after another processing operation according to one or more embodiments of the invention. As depicted in FIG. 10, a top spacer 80 can be formed on upper surfaces of the fins (110A-110F), the high dielectric constant layer 50, the WFM 60, and the low resistance metal 70, for example, by GCIB.

Figure 11:
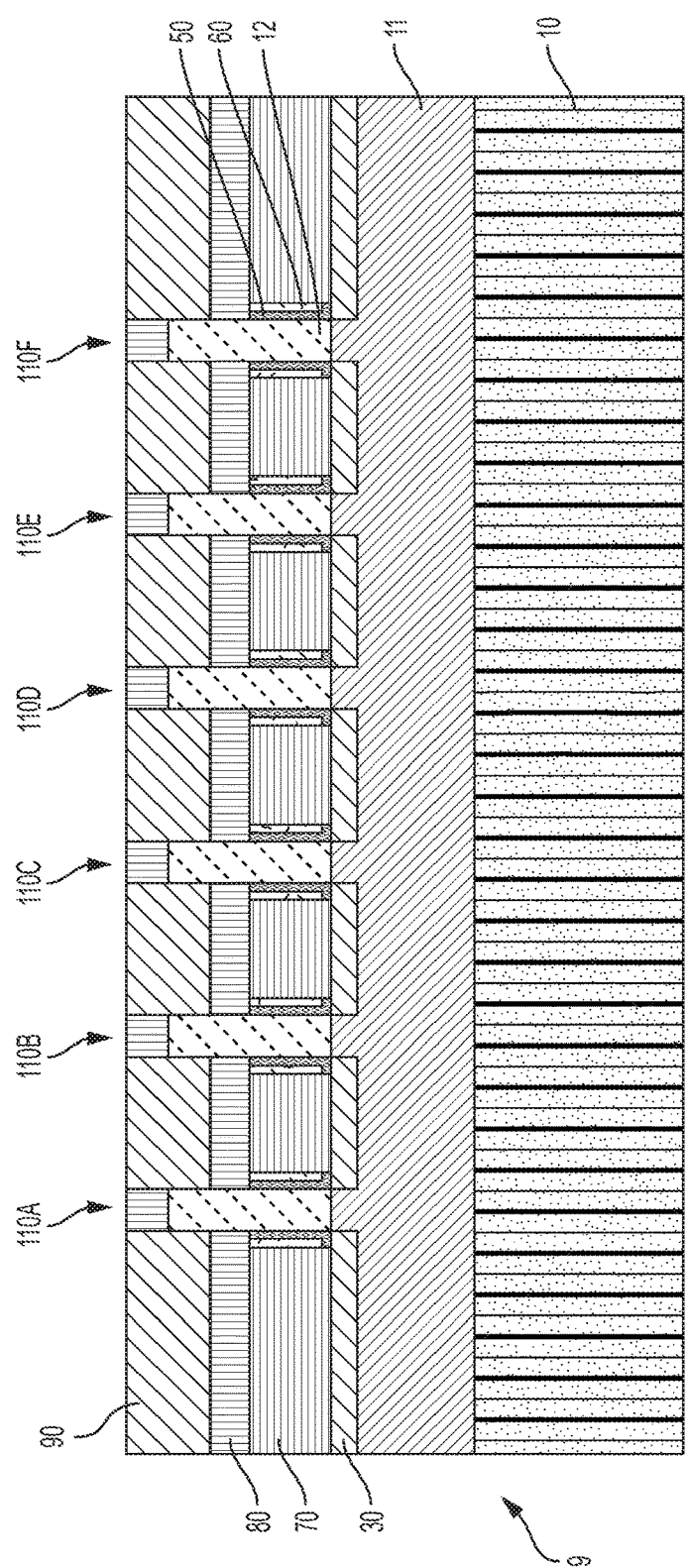
FIG. 11 depicts a cross-sectional view of the semiconductor structure after another processing operation according to one or more embodiments of the present invention.

FIG. 11 depicts a cross-sectional view of the VFET semiconductor structure after another processing operation according to one or more embodiments of the invention. As depicted in FIG. 11, an interlayer dielectric (ILD) layer 90 fill can be performed. The ILD layer 90 can be polished using, for example, CMP.

The ILD 90 can be, for example, an oxide such as silicon oxide. A CMP can be utilized to remove excess portions of ILD 90 such that the upper surface of ILD 90 is coplanar with the upper surfaces of top spacer 80.

Figure 12:
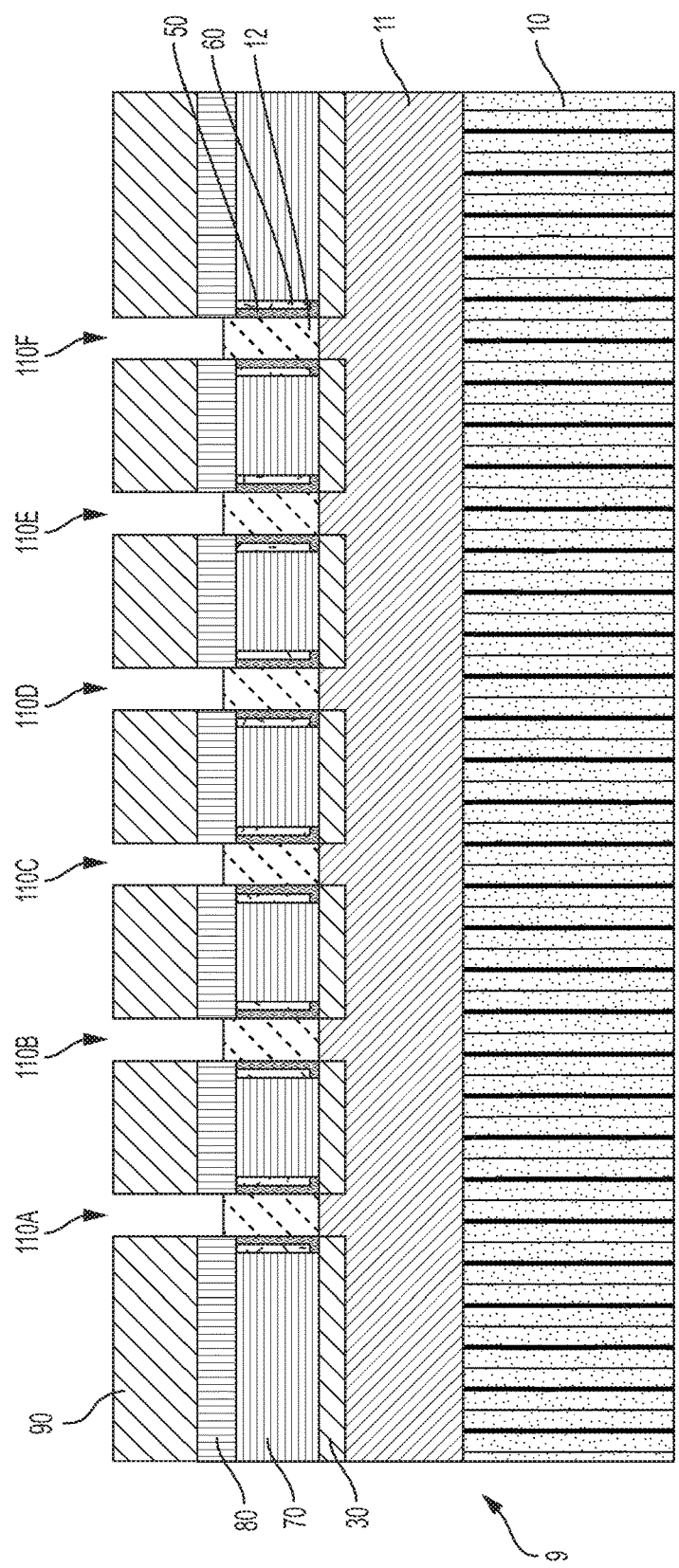
FIG. 12 depicts a cross-sectional view of the semiconductor structure after another processing operation according to one or more embodiments of the present invention.

FIG. 12 depicts a cross-sectional view of the VFET semiconductor structure after another processing operation according to one or more embodiments of the invention. As depicted in FIG. 12, exposed portions of the top spacer 80 on the semiconductor fins (110A-110F) can be removed. In one or more embodiments of the invention, the semiconductor fins (110A-110F) can be recessed.

Figure 13:
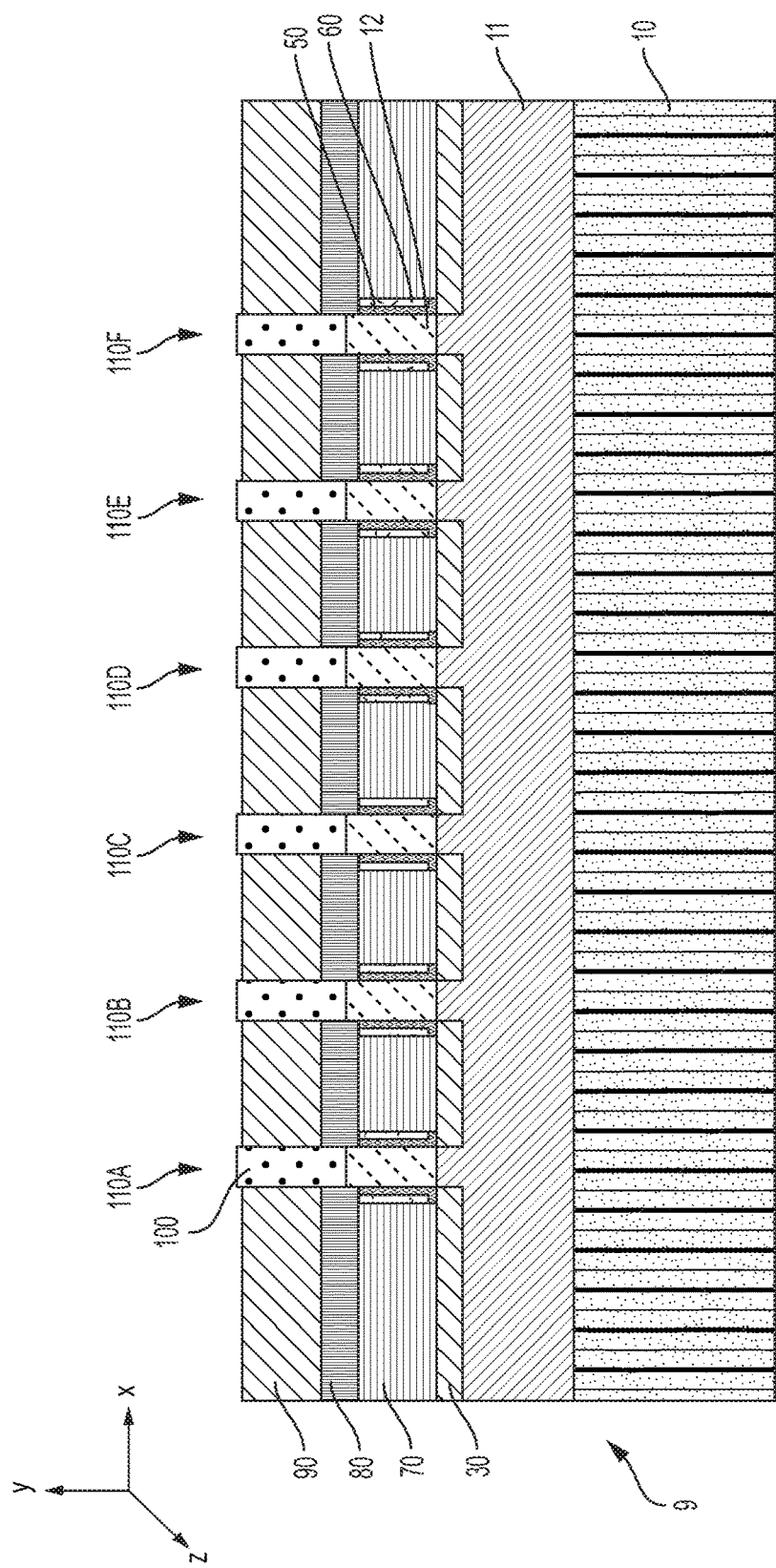
FIG. 13 depicts a cross-sectional view of the semiconductor structure after another processing operation according to one or more embodiments of the present invention.

FIG. 13 depicts a cross-sectional view of the VFET semiconductor structure after another processing operation according to one or more embodiments of the invention. As depicted in FIG. 13, a top source/drain region 100 can be formed, for example, epitaxially, on exposed top portions of the semiconductor fins (110A-110F).

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ to $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In view of the structure of FIG. 13, as described above, a uniform thickness of WFM can be formed for each VFET, where the thickness is measured in a direction in which the VFETs are arranged (e.g., in an x-direction orthogonal to the VFET channel). The uniform thickness of WFM can provide a uniform threshold voltage for each VFET in a region from the bottom spacer 30 through the low resistance metal 70, for example, in a y-direction (i.e., in a direction parallel to the VFET channel). As previously described herein, the source-drain current can flow in the VFETs in a direction perpendicular to a substrate surface, e.g., the source-drain current can flow in the y-direction.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor structure, the method comprising:
   forming a semiconductor fin on a substrate;
   forming a hard mask on the semiconductor fin;
   decreasing a width of the semiconductor fin;
   forming a spacer layer on a surface of the substrate;
   forming a high dielectric constant layer on exposed surfaces of the semiconductor fin and the spacer layer;
   forming a work function metal layer on the high dielectric constant layer;
   removing portions of the work function metal layer and the high dielectric constant layer to expose portions of the spacer layer, wherein a thickness of the remaining work function metal layer on sidewalls of the semiconductor fin is uniform and further wherein after removing the work function metal layer and the high dielectric constant layer from the spacer layer, a combined width of the semiconductor fin, the high dielectric constant layer, and the work function metal layer is equal to a width of the hard mask;

forming a low resistance metal on exposed portions of the spacer layer;

removing the hard mask layer, a portion of the low resistance metal, and the work function metal layer and the high dielectric constant layer from a portion of sidewalls of the semiconductor fin; and depositing a top spacer on the semiconductor fin, a remaining portion of the low resistance metal, a remaining portion of the work function metal layer, and a remaining portion of the high dielectric constant layer.

2. The method according to claim 1, wherein decreasing the width of the semiconductor fin includes etching each sidewall of the semiconductor fin.

3. The method according to claim 2, wherein decreasing the width of the semiconductor fin includes etching from about 2 to about 7 nm per side of the semiconductor fin.

4. The method according to claim 3, wherein the width of the semiconductor fin prior to said decreasing is from about 10 to about 30 nm.

5. The method according to claim 1, wherein an upper surface of a remaining portion of the low resistance metal, an upper surface of a remaining portion of the work function metal layer, and an upper surface of a remaining portion of the high dielectric constant layer are planar.

6. The method according to claim 1, further comprising depositing an interlayer dielectric layer on the top spacer over the remaining portion of the low resistance metal, the remaining portion of the work function metal layer, and the remaining portion of the high dielectric constant layer.

7. The method according to claim 6, further comprising removing the top spacer on the semiconductor fin.

* * * * *